United States Patent

Matsumoto et al.

(10) Patent No.: US 9,683,904 B2
(45) Date of Patent: Jun. 20, 2017

(54) REFERENCE VOLTAGE GENERATOR FOR TEMPERATURE SENSOR WITH TRIMMING CAPABILITY AT TWO TEMPERATURES

(71) Applicant: SanDisk Technologies LLC, Plano, TX (US)

(72) Inventors: Masahide Matsumoto, Tokyo (JP); Ryuji Yamashita, Tokyo (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/364,756

(22) Filed: Nov. 30, 2016

(65) Prior Publication Data

US 2017/0082505 A1 Mar. 23, 2017

Related U.S. Application Data

(62) Division of application No. 14/175,226, filed on Feb. 7, 2014, now Pat. No. 9,541,456.

(51) Int. Cl.
*G01K 15/00* (2006.01)
*G01K 7/00* (2006.01)
(Continued)

(52) U.S. Cl.
CPC ............ *G01K 15/005* (2013.01); *G01K 7/00* (2013.01); *G05F 3/245* (2013.01); *G11C 16/06* (2013.01);
(Continued)

(58) Field of Classification Search
USPC ................................ 374/1, 163, 183; 327/513
See application file for complete search history.

(56) References Cited

U.S. PATENT DOCUMENTS 5,532,962 A  7/1996 Auclair et al.
5,570,315 A  10/1996 Tanaka et al.
(Continued)

FOREIGN PATENT DOCUMENTS

CN  100428105 C  10/2008

OTHER PUBLICATIONS

"Notice of Allowance and Fee(s) Due mailed Nov. 2, 2016," U.S. Appl. No. 14/175,226, filed Feb. 7, 2014, eight pages.
(Continued)

*Primary Examiner* — Mirellys Jagan
(74) *Attorney, Agent, or Firm* — Foley & Lardner LLP

(57) ABSTRACT

A temperature sensor circuit has a reference voltage generator that is trimmable at two temperatures for increased accuracy. The reference voltage generation section generates a reference voltage, the level of which is trimmable. A voltage divider section is connected to receive the reference voltage from the reference voltage generation section and generate a plurality of comparison voltage levels determined by the reference voltage and a trimmable resistance. An analog-to-digital converter can then be connected to a temperature dependent voltage section to receive the temperature dependent output voltage, such as a proportional to absolute temperature type (PTAT) behavior, and connected to the voltage divider section to receive the comparison voltage levels. The analog to digital converter generates an output indicative of the temperature based upon a comparison of the temperature dependent output voltage to the comparison voltage levels.

16 Claims, 6 Drawing Sheets

(51) Int. Cl.
*G11C 16/06* (2006.01)
*H03M 1/38* (2006.01)
*H03M 1/12* (2006.01)
*G05F 3/24* (2006.01)
*H03M 7/16* (2006.01)

(52) U.S. Cl.
CPC ............... *H03M 1/12* (2013.01); *H03M 1/38* (2013.01); *H03M 7/165* (2013.01); *G01K 2219/00* (2013.01)

(56) References Cited

U.S. PATENT DOCUMENTS

| | | | |
|---|---|---|---|
| 5,903,495 | A | 5/1999 | Takeuchi et al. |
| 6,046,935 | A | 4/2000 | Takeuchi et al. |
| 6,181,191 | B1 | 1/2001 | Paschal |
| 6,560,152 | B1 | 5/2003 | Cernea |
| 6,735,546 | B2 | 5/2004 | Scheuerlein |
| 6,778,008 | B2 | 8/2004 | Andrews |
| 6,801,454 | B2 | 10/2004 | Wang et al. |
| 6,839,281 | B2 | 1/2005 | Chen et al. |
| 6,954,394 | B2 | 10/2005 | Knall et al. |
| 6,956,516 | B2 | 10/2005 | Furuichi |
| 7,057,958 | B2 | 6/2006 | So et al. |
| 7,199,646 | B1 | 4/2007 | Zupcau et al. |
| 7,236,023 | B2 | 6/2007 | Thorp et al. |
| 7,269,092 | B1 | 9/2007 | Miwa |
| 7,277,343 | B1 | 10/2007 | So et al. |
| 7,283,414 | B1 | 10/2007 | So et al. |
| 7,342,831 | B2 | 3/2008 | Mokhlesi et al. |
| 7,391,650 | B2 | 6/2008 | Mokhlesi et al. |
| 7,427,158 | B2 * | 9/2008 | Yoshida .................. G01K 7/01 327/513 |
| 7,643,889 | B2 * | 1/2010 | Jeong ...................... G01K 7/01 324/224 |
| 7,646,659 | B2 | 1/2010 | Sako |
| 7,889,575 | B2 | 2/2011 | Wang et al. |
| 8,004,917 | B2 | 8/2011 | Pan et al. |
| 8,152,363 | B2 * | 4/2012 | Nagahisa ................ G01K 7/01 374/1 |
| 8,228,739 | B2 | 7/2012 | Pan et al. |
| 8,817,514 | B2 | 8/2014 | Samachisa et al. |
| 9,059,401 | B2 | 6/2015 | Scheuerlein |
| 9,190,134 | B2 | 11/2015 | Samachisa |
| 9,329,615 | B2 * | 5/2016 | Neidorff .................. G05F 3/30 |
| 2002/0083776 | A1 * | 7/2002 | Tanizawa ............. G01D 3/0365 73/753 |
| 2003/0152390 | A1 | 8/2003 | Stewart et al. |
| 2005/0105367 | A1 | 5/2005 | Kim et al. |
| 2006/0266646 | A1 * | 11/2006 | Kimura .................. H01C 10/14 204/425 |
| 2007/0052473 | A1 | 3/2007 | McLeod |
| 2007/0098041 | A1 | 5/2007 | Seo |
| 2007/0171956 | A1 | 7/2007 | Noguchi |
| 2007/0286004 | A1 | 12/2007 | Kim et al. |
| 2008/0007244 | A1 | 1/2008 | Draxelmayr |
| 2008/0018316 | A1 | 1/2008 | Chang et al. |
| 2008/0031066 | A1 | 2/2008 | Nandi |
| 2008/0091378 | A1 | 4/2008 | Jeong et al. |
| 2008/0094908 | A1 | 4/2008 | Mokhlesi et al. |
| 2008/0094930 | A1 | 4/2008 | Mokhlesi et al. |
| 2008/0158947 | A1 | 7/2008 | Li et al. |
| 2008/0158969 | A1 | 7/2008 | Moogat et al. |
| 2008/0158970 | A1 | 7/2008 | Sekar et al. |
| 2008/0158975 | A1 | 7/2008 | Sekar et al. |
| 2008/0159000 | A1 | 7/2008 | Li et al. |
| 2008/0192398 | A1 * | 8/2008 | Inoue ...................... G05F 1/56 361/103 |
| 2008/0238530 | A1 | 10/2008 | Ito et al. |
| 2008/0247253 | A1 | 10/2008 | Nguyen et al. |
| 2008/0247254 | A1 | 10/2008 | Nguyen et al. |
| 2008/0316809 | A1 | 12/2008 | Herner |
| 2009/0003109 | A1 | 1/2009 | Thorp et al. |
| 2009/0003110 | A1 | 1/2009 | Thorp et al. |
| 2009/0091311 | A1 | 4/2009 | Kang |
| 2009/0142858 | A1 * | 6/2009 | Landsberger ........ H01C 17/267 438/5 |
| 2009/0146730 | A1 | 6/2009 | Chen |
| 2009/0296465 | A1 | 12/2009 | Wang et al. |
| 2010/0073069 | A1 | 3/2010 | Wang et al. |
| 2010/0074033 | A1 | 3/2010 | Pan et al. |
| 2010/0134180 | A1 | 6/2010 | Smith et al. |
| 2011/0200070 | A1 | 8/2011 | Makinwa et al. |
| 2012/0081957 | A1 | 4/2012 | Kim et al. |
| 2013/0136149 | A1 * | 5/2013 | Soenen ................... G01K 7/16 374/1 |
| 2013/0188431 | A1 | 7/2013 | Scheuerlein et al. |
| 2013/0241522 | A1 | 9/2013 | Youssefi |
| 2015/0168968 | A1 * | 6/2015 | Privitera ................ H01C 7/006 327/513 |
| 2015/0226614 | A1 | 8/2015 | Matsumoto et al. |

OTHER PUBLICATIONS

"Office Action mailed Aug. 16, 2016," U.S. Appl. No. 14/175,226, filed Feb. 7, 2014, 16 pages.

Guan et al, "A 3 V 110 uW 3.1 ppm/C Curvature-compensated CMOS Bandgap Reference," Analog Integrated Circuits and Signal Processing 62(2):113-119, published online Jun. 26, 2009, published in print Feb. 2010.

Gunawan et al., "A Curvature-Corrected Low-Voltage Bandgap Reference," IEEE Journal of Solid-State Circuits 28 6):667-670, Jun. 1993.

Hsaio et al., "A 1.5-V 10-ppm/oC 2nd-Order Curvature-Compensated CMOS Bandgap Reference with Trimming," IEEE International Symposium on Circuits and Systems, pp. 565-568, date of conference May 21-24, 2006, date of presentation May 21, 2006.

International Search Report and Written Opinion mailed on Apr. 22, 2015, International Patent Application No. PCT/US2015/014319, filed Feb. 3, 2015, 10 pages.

Malcovati et al., "Curvature Compensated BiCMOS Bandgap with 1 V Supply Voltage," Proceedings of the 26th European Solid-State Circuits Conference, IEEE, Sep. 19-21, 2000, 4 pages.

Mok et al., "Design Considerations of Recent Low-voltage Low-Temperature-Coefficient CMOS Bandgap Voltage Reference," Proceedings of the Custom Integrated Circuits Conference, Nov. 22, 2004, IEEE, 8 pages.

Ning et al, "A Low Drift Curvature-compensated Bandgap Reference with Trimming Resistive Circuit," Journal of Zhejiang University Science C Comput & Electron 12(8):698-706, Aug. 2011.

Tao et al., "Low voltage Bandgap Reference with Closed Curvature Compensation," Journal of Semiconductors 30(3): 035006-1-035006-4, Mar. 2009.

* cited by examiner

REFERENCE VOLTAGE GENERATOR FOR TEMPERATURE SENSOR WITH TRIMMING CAPABILITY AT TWO TEMPERATURES

RELATED CROSS-REFERENCED APPLICATION

This application is a divisional of U.S. patent application Ser. No. 14/175,226, filed Feb. 7, 2014, which is incorporated herein in its entirety by this reference.

FIELD OF THE INVENTION

This invention pertains generally to the temperature sensor circuits and, more particularly, to the trimming of such circuits.

BACKGROUND

Temperature sensor circuits can be used as peripheral circuits on devices that use a temperature value or code to adjust their operations. For example, the bias levels on non-volatile memory circuits vary based upon temperature. (For example, the temperature value from a temperature sensor or digital thermometer, such as is described in U.S. Pat. No. 7,889,575 or U.S. Pat. No. 8,228,739, is used for bias circuitry on a non-volatile memory circuit.) For accurate operation, the temperature code from such temperature sensors should be accurate. In practice, such temperature sensors have inaccuracy on their output due to tolerances in manufacturing. Consequently, some kind of calibration is necessary in order to correct the output (temperature code).

SUMMARY OF THE INVENTION

In a first set of aspects, a temperature sensor circuit includes a temperature dependent voltage section, a reference voltage generation section, a voltage divider section, and an analog to digital converter. The temperature dependent voltage section provides an output voltage having a linear type dependence on temperature. The reference voltage generation section generates a reference voltage, where the level of the reference voltage is trimmable. The voltage divider section is connected to receive the reference voltage from the reference voltage generation section and generate from it a plurality of comparison voltage levels having a first level determined by the reference voltage and a second level dependent upon a first trimmable resistance, the second level being lower than the first. The analog to digital converter is connected to the temperature dependent voltage section to receive the temperature dependent output voltage and connected to the voltage divider section to receive the comparison voltage levels. The analog to digital converter generates an output indicative of the temperature based upon a comparison of the temperature dependent output voltage to the comparison voltage levels.

Other aspects relate to a method of operating a temperature sensor circuit. The temperature sensor circuit includes: a temperature dependent voltage section providing a temperature dependent output voltage; a reference voltage generation section generating a reference voltage; a voltage divider section connected to receive the reference voltage from the reference voltage generation section and generate therefrom a plurality of comparison voltage levels; and an analog to digital converter connected to receive the temperature dependent output voltage and the comparison voltage levels and generate therefrom an output indicative of the temperature. The method includes trimming at a first temperature the level of the reference voltage based upon the output indicative of the temperature; and trimming at a second temperature a variable resistance in the voltage divider section based upon the output indicative of the temperature, wherein the first temperature differs from the second temperature.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Figure 1:
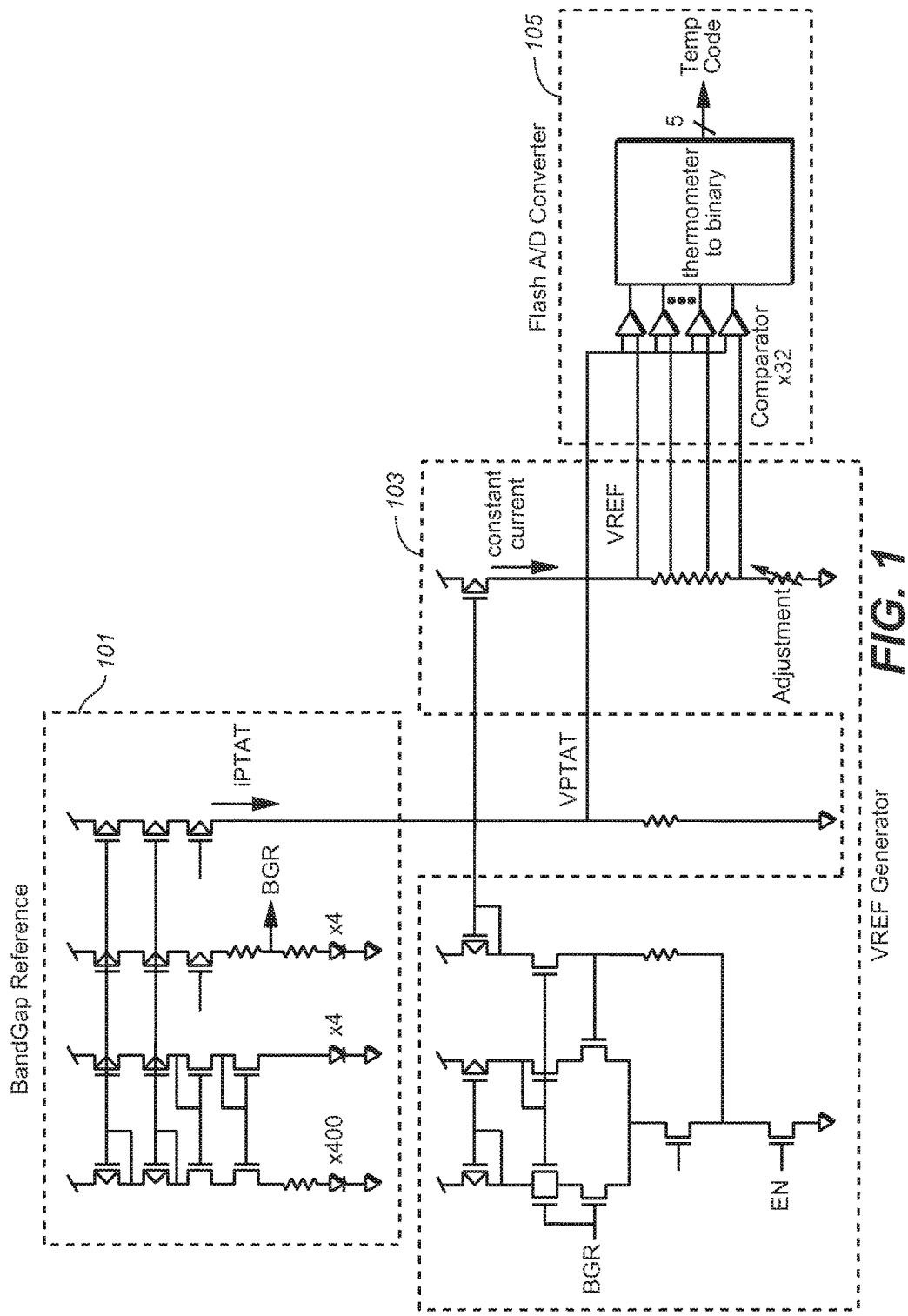
FIG. 1 shows an example of a temperature sensor circuit.

The following considers temperature code error from temperature sensors and the trimming of such sensors. An example of temperature sensor circuit, such as is shown in FIG. 1, can be constructed using a band gap reference voltage generator section 101, which produces a voltage VPTAT that is proportional to absolute temperature (PTAT), a reference voltage generator section 103, which produces a voltage VREF, that is a temperature-independent reference voltage, and an analogue-to-digital converter (ADC) 105, that compares VPTAT voltage and VREF voltage to produce a digital output (temperature code) at respective temperatures. The number of VREF voltages depends on the number of bits (5 in this example) of ADC, and each VREF voltage corresponds to each temperature level, as shown in FIG. 2.

Figure 2:
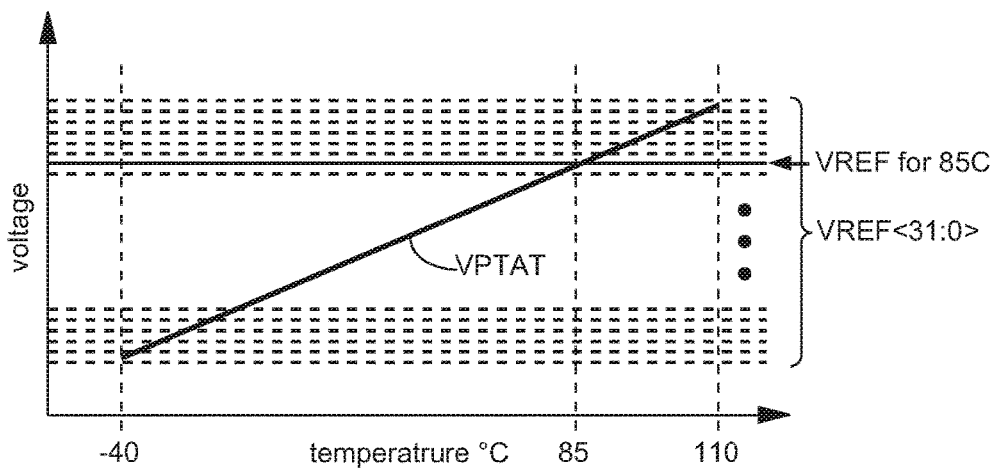
FIG. 2 illustrates desired temperature sensor behavior.

FIG. 2 illustrates the desired sort of behavior for the temperature sensor circuit. In this example, the VPTAT rises linearly over the range −40 C to 110 C. The horizontal lines correspond to the reference values VREF<31:0> of the 5 bit, in this example, reference value, so that each step is something like 5 degrees C. Here the VREF value for 85 C, which is a common reference value, is noted by the darker line.

Figure 3:
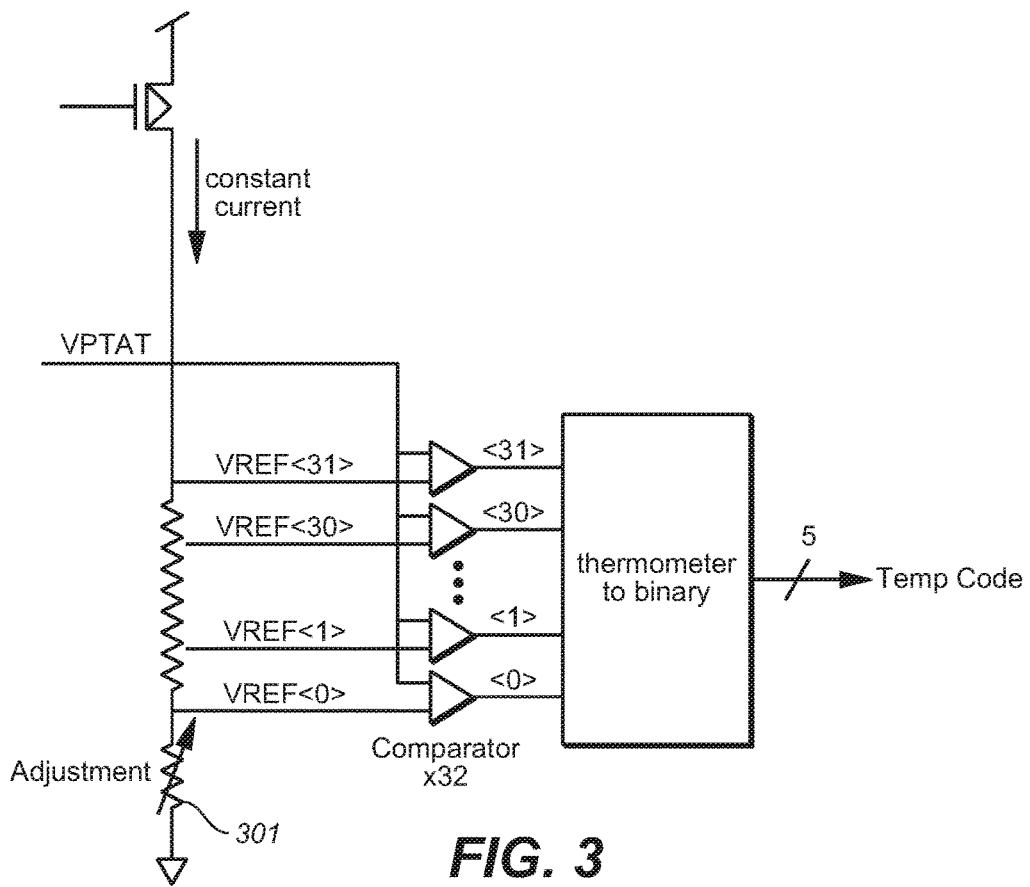
FIG. 3 is an example of a trimmable reference voltage generation element.

As noted, FIG. 2 corresponds to the desired or ideal behavior. In practice, temperature sensors have inaccuracies on the digital output due to tolerances in manufacturing. Because of this, some kind of calibration is desirable in order to correct the digital output (temperature code). In one design, the VREF voltage generator has an ability to adjust the VREF voltage so that digital output is corrected to the desired temperature code at a certain temperature. This can be done by the Adjustment resistor 301 as shown in FIG. 3.

Figure 4:
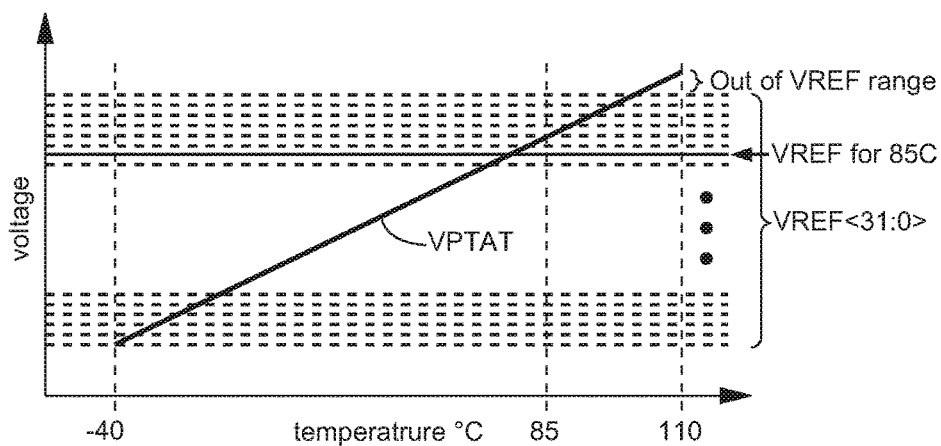
FIGS. 4 and 5 illustrate a trimming process for a circuit such as that illustrated in the FIG. 3.
Figure 5:
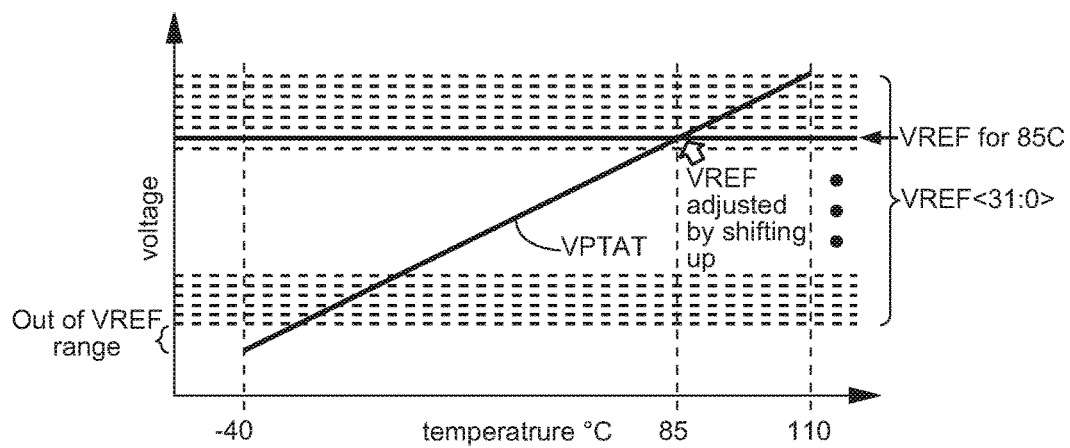

For instance, FIG. 4 illustrates the case that the VREF voltage corresponding to 85 C does not match with VPTAT voltage at 85 C. For the sensor to be accurate, the VREF voltage corresponding to 85 C can be adjusted to match with VPTAT voltage at 85 C through the Adjustment resistor 301 at the bottom of the voltage divider of FIG. 3. By trimming the voltage divider in this way, the VREF voltage corresponding to 85 C can match the VPTAT value at 85 C; however, this will also shift all of the VREF voltages corresponding to the other temperatures with this adjustment, as shown in FIG. 5. As a consequence, away from the trimming temperature the VPTAT curve may be shifted out of the VREF range, as illustrated in FIG. 5 at −40 C. (Although the discussion here refers to matching at 85 C, for example, as the temperature code steps in the example are on the order of 5 C, in the case of a temperature code output of 85 C, a more precise description is that the VPTAT voltage is in-between a VREF voltage which is equal to the VPTAT voltage at 82.5 C and another VREF voltage which is equal to the VPTAT voltage at 87.5 C.)

Figure 6:
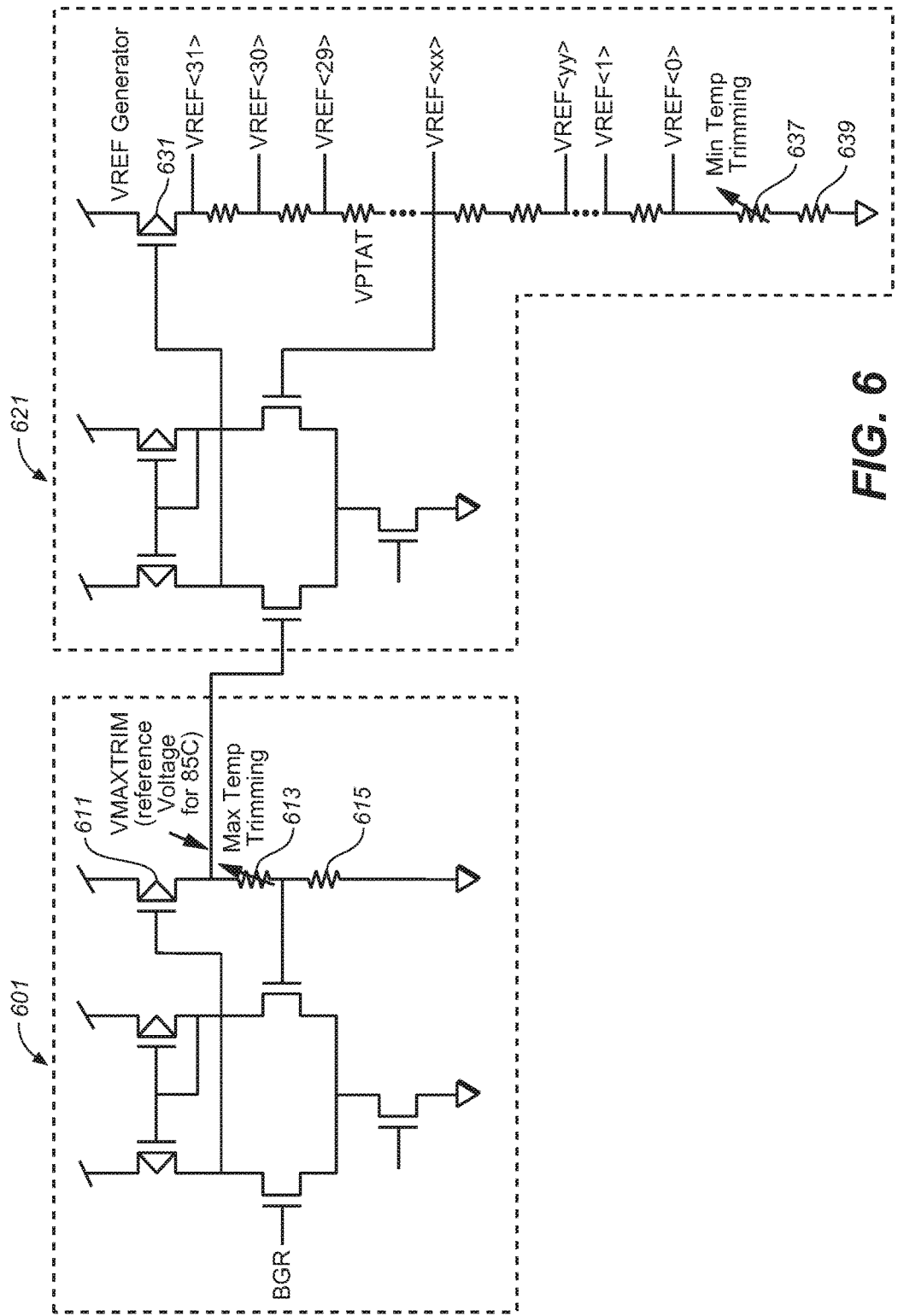
FIG. 6 is an exemplary embodiment of circuitry to generate the reference voltages.
Figure 7:
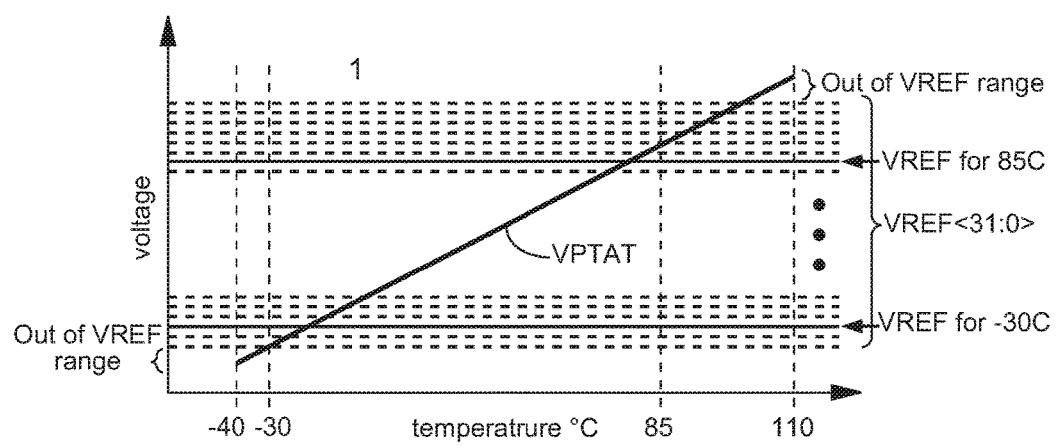
FIG. 7-10 illustrate an exemplary trimming process for the exemplary embodiment.

To help overcome this limitation, an exemplary embodiment for a VREF generator can include two parts, as shown in FIG. 6 and has ability for VREF voltage adjustment at two different temperatures. A trimmable reference voltage generator section produces a VMAXTRIM voltage, which is an input signal for the voltage divider and is a reference voltage taken to correspond to the high trim level of, in this example, 85 deg C. In this trimmable reference voltage generator, the output VMAXTRIM is taken from a node between the PMOS transistor 611 and a trimmable resistance connected in series between the supply level and ground. (It should be noted that VMAXTRIM is for the higher of the trim levels being used, such as corresponding to 85 C in this example, which is not—or at least not necessarily—corresponding to the highest of the temperatures of the sensor.) Here, the trimmable resistance is formed of a trimmable portion 613 in series with a fixed portion 615. The gate of PMOS 611 is controlled by the output of an op-amp 601. One input of the op-amp is a reference level, here BGR, and is taken to be largely temperature independent and the other input is taken from a node between the trimmable resistance 613 and the fixed resistance 615 and reflects the output reference voltage VMAXTRIM. The variable resistance 613 can then be trimmed to set the VMAXTRIM voltage to correspond to the higher trimming level. The example of FIG. 6 illustrates a particular implementation of an op-amp and output chain (PMOS 611, resistances 613 and 615) is shown, but other implementation can be used.

To the right of FIG. 6, the voltage divider section supplies the reference voltages corresponding the VREF values for the temperature values and uses the VMAXTRIM voltage as a reference voltage. As in FIG. 1 or 3, the exemplary embodiment is again based on a 5 bit flash A to D converter and the reference voltages VREF<0> to VREF<31> are from nodes in a resistor chain formed between a PMOS 631 and a resistance formed of a trimmable section Min Temp Trimming resistance 637 and a fixed resistance 639. The gate of PMOS 631 is now set by the output of an op-amp 621, which has one of its inputs connected to receive VMAXTRIM and has the other input connect to the node for VREF<xx> of the resistor chain that corresponds to the high trim value (85 C in this example). As with op-amp 601, the particular example shown for op-amp 621 is just one specific implementation.

Under the arrangement of FIG. 6, the reference voltage generator has trimming resistor, the Max Temp Trimming resistor 613, that adjusts VMAXTRIM voltage and also VREF voltage corresponding to the high trim level, or 85 deg C. in this case. The voltage divider section also has trimming resistor, Min Temp Trimming resistor 637, that adjusts the VREF voltage corresponding to lower trimming level, or −30 deg C. in this case. This allows for the both ends of the range to match. (As with the VMAXTRIM notation, it should be noted that "Min Temp Trimming" is for the lower of the trim levels being used, not necessarily corresponding to the lowest of the temperatures of the sensor.)

Figure 8:
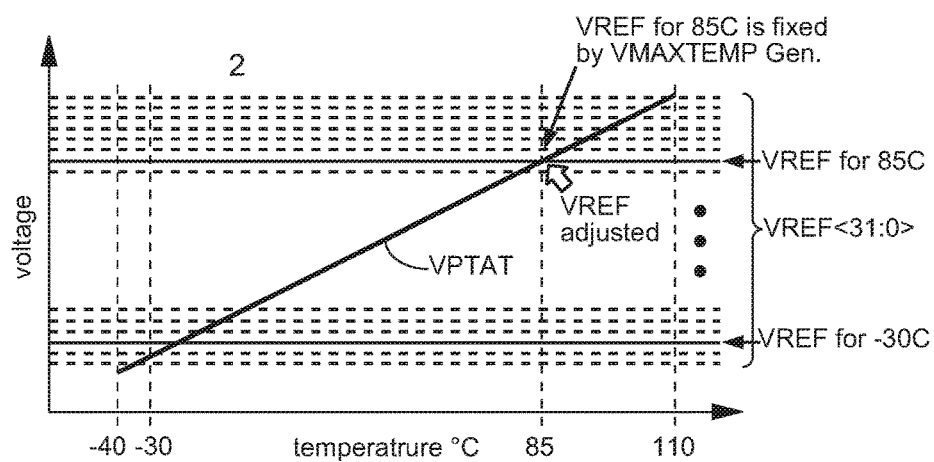

An example of the trimming procedure can be illustrated with respect to FIGS. 7-10. For example, taking the case where the VREF value corresponding to 85 deg C. does not match with VPTAT voltage at 85 C, as shown in the FIG. 7, the VREF voltage corresponding to 85 C can be adjusted to match with VPTAT voltage at 85 C. The VREF voltage is adjusted with Max Temp Trimming resistor 613 in FIG. 6 so that the VREF voltage corresponding to 85 C matches with VPTAT at 85 C in the VREF generator. The voltage difference between each VREF voltage corresponding to each temperature is changed by adjusting VMAXTRIM voltage, as shown in FIG. 8.

Figure 9:
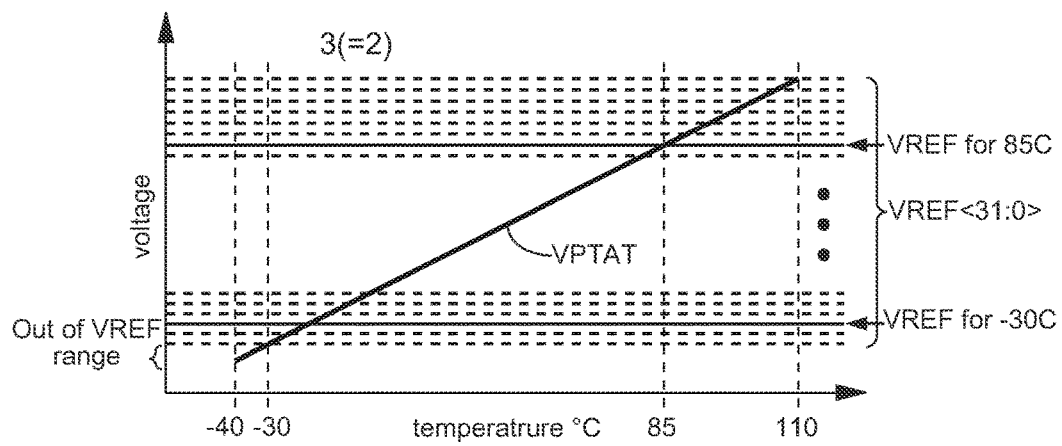

Although the first trimming process will set the voltage to the desired high end of the temperature range, the VREF voltages corresponding to the other temperatures may not be matched with VPTAT voltages at the other temperatures. After the first trimming at, in this example, 85 C, as shown in FIG. 9, it is desirable to do another trimming at another temperature. FIG. 9 (which is the same as FIG. 8, but with different annotation) shows that VREF voltages corresponding to −30 C does not match with VPTAT voltage at −30 C, for instance.

Figure 10:
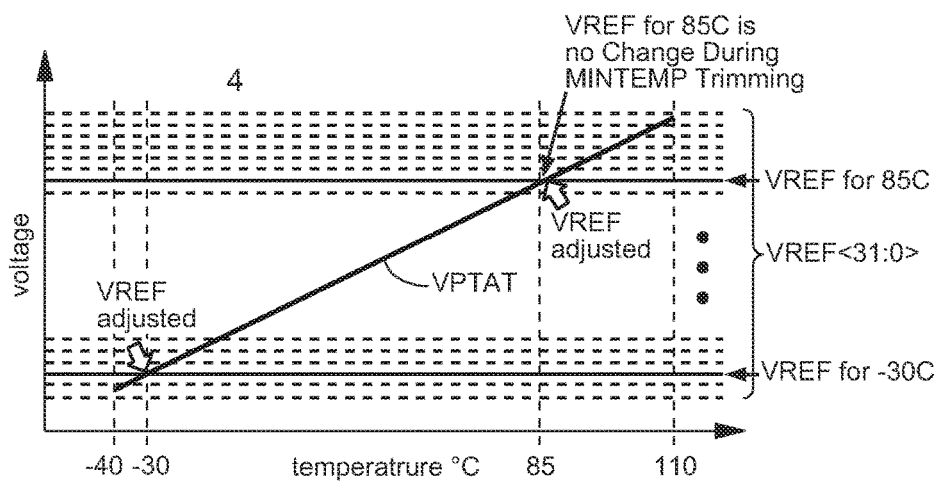

In exemplary VREF generator, VREF voltage corresponding to, in this example, −30 C is adjusted with the Min Temp Trimming resistor 637, so that it matches with VPTAT voltage at −30 C. As the VREF voltage corresponding to 85 C is fixed by VMAXTRIM, it does not shift while the VREF voltage adjustment with Min Temp Trimming resistor 637 (FIG. 6), as shown in FIG. 10. As the VREF voltage adjustment is done at two difference temperatures, other VREF voltages corresponding to the other temperatures match with the VPTAT voltages at other temperatures.

The discussion above is based on a particular set of embodiments, but can be applied more generally. For example, the analog to digital conversion of the exemplary embodiments uses a flash type of A-to-D converter based on the values from the nodes of the resistor chain, but other implementation can readily be used. For example, a successive approximation, or SAR, A-to-D converter can be used.

The exemplary embodiments are also based on the temperature dependent voltage level being linear in temperature (or at least a "linear-type" behavior, in that higher order behavior can be neglected and the voltage is sufficiently linear). In particular, the exemplary embodiment used a band gap reference type of circuit providing a proportional to absolute temperature (PTAT) behavior, but other arrangements can be used. For example, an inverse proportional to absolute temperature behavior can be used, where the higher trimming level voltage would now correspond to the lower trimming voltage and vice versa. In either case, circuits with temperature dependent outputs other band gap based circuits can be used; and although a linear-type temperature dependence is most easily implemented for most other applications, other temperature dependences can also be used.

For any of these embodiments or variations, the VREF generator has ability to adjust VREF voltages at two different temperatures. When trimming is done at just one temperature only, VREF voltage corresponding to a particular temperature matches with VPTAT (or other temperature dependent) voltage at that temperature; however, it may not be matched at the other temperatures. With the ability to match at two temperatures, the VREF voltages corresponding to the other temperatures can also match with the PTAT voltage at the other temperatures.

Such reference voltage generating circuitry can be implemented as peripheral elements on integrated circuits for many applications. For example, the temperature value from a temperature sensor or digital thermometer, such as is described in U.S. Pat. No. 7,889,575 or U.S. Pat. No. 8,228,739, is used for bias circuitry on a non-volatile memory circuit, such as flash NAND memory and non-volatile memories having a 3D array type structure. More detail on NAND memory devices can be found in US patent and publication numbers 20080158969; U.S. Pat. Nos. 5,570,315; 5,903,495; and 6,046,935, for example. More detail on non-volatile memory having a 3D array structure can be found in U.S. patent application Ser. Nos. 13/323,703; 14/153,794; and 14/149,601, for example.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method, comprising:
   performing a trimming operation on a temperature sensor circuit in which a temperature dependent voltage section provides a temperature dependent output voltage, a reference voltage generation section generates a reference voltage, a voltage divider section is connected to receive the reference voltage from the reference voltage generation section and generate therefrom a plurality of comparison voltage levels, and an analog to digital converter is connected to receive the temperature dependent output voltage and the comparison voltage levels and generate therefrom an output indicative of the temperature, the trimming operation including:
   trimming at a first temperature a level of the reference voltage based upon the output indicative of the temperature; and
   trimming at a second temperature a variable resistance in the voltage divider section based upon the output indicative of the temperature, wherein the first temperature differs from the second temperature.

2. The method of claim 1, wherein the temperature dependent output voltage is proportional to absolute temperature behavior.

3. The method of claim 1, wherein the first temperature is greater than the second temperature.

4. The method of claim 1, wherein the second temperature is greater than the first temperature.

5. The method of claim 1, wherein the trimming the level of the reference voltage includes setting a resistance value.

6. The method of claim 1, wherein the level of the reference voltage is trimmed prior to trimming the variable resistance in the voltage divider section.

7. The method of claim 1, wherein the temperature dependent output voltage is inverse to proportional to absolute temperature type behavior.

8. The method of claim 1, wherein the temperature dependent output voltage of the temperature dependent voltage section is generated using a band gap circuit.

9. The method of claim 1, where the analog to digital converter is a flash-type analog to digital converter.

10. The method of claim 1, where the analog to digital converter is a successive approximation type analog to digital converter.

11. The method of claim 1, wherein the temperature sensor circuit is formed as part of a non-volatile memory circuit having a flash NAND type of structure for a memory array formed thereon.

12. The method of claim 1, wherein the temperature sensor circuit is formed as part of a non-volatile memory circuit having a 3D type of structure for a memory array formed thereon.

13. The method of claim 1, wherein the voltage divider section includes a set of series connected elements connected between a supply level and ground, including:
   a first transistor whose gate voltage is based on the reference voltage;
   a first trimmable resistance; and
   a plurality of resistances connected in series, wherein the series of resistances is connected to the supply level through the first transistor and connected to the ground through the first trimmable resistance, and wherein the comparison voltage levels are taken from nodes between the elements of the set of series connected elements.

14. The method of claim 13, wherein the reference voltage generation section includes:
   an op-amp having a first input connected to receive an additional reference level, a second input, and an output; and
   a PMOS transistor, a second trimmable resistance, and a fixed resistance connected in series between the supply level and the ground,
   wherein the second input of the op-amp is connected to a node between the second trimmable resistance and the fixed resistance, and a gate of the PMOS transistor is connected to the output of the op-amp.

15. The method of claim 13, wherein the first transistor is a first PMOS transistor.

16. The method of claim 15, wherein the voltage divider section further includes:
   an op-amp having a first input connected to receive the reference voltage, a second input connected to a node of the set of series connected elements, and an output connected to the gate of the first PMOS transistor.

* * * * *